United States Patent
Quinton et al.

(10) Patent No.: US 9,428,843 B2
(45) Date of Patent: Aug. 30, 2016

(54) RARE EARTH OXYORTHOSILICATE SCINTILLATION CRYSTALS

(71) Applicant: Siemens Medical Solutions USA, Inc., Malvern, PA (US)

(72) Inventors: Brant Quinton, Knoxville, TN (US); Mark S. Andreaco, Knoxville, TN (US); Troy Marlar, Knoxville, TN (US); Peter Carl Cohen, Knoxville, TN (US); Merry A. Koschan, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 173 days.

(21) Appl. No.: 14/166,171

(22) Filed: Jan. 28, 2014

(65) Prior Publication Data

US 2014/0271436 A1    Sep. 18, 2014

Related U.S. Application Data

(60) Provisional application No. 61/782,978, filed on Mar. 14, 2013.

(51) Int. Cl.

| | |
|---|---|
| *C30B 1/10* | (2006.01) |
| *C30B 29/34* | (2006.01) |
| *C30B 29/28* | (2006.01) |
| *C30B 1/02* | (2006.01) |
| *C09K 11/77* | (2006.01) |
| *C30B 15/00* | (2006.01) |
| *C30B 33/02* | (2006.01) |
| *C30B 33/08* | (2006.01) |

(52) U.S. Cl.
CPC ........... *C30B 29/34* (2013.01); *C09K 11/7774* (2013.01); *C30B 1/02* (2013.01); *C30B 1/10* (2013.01); *C30B 15/00* (2013.01); *C30B 29/28* (2013.01); *C30B 33/02* (2013.01); *C30B 33/08* (2013.01)

(58) Field of Classification Search
CPC ............ C30B 1/10; C30B 1/02; C30B 29/28
See application file for complete search history.

(56) References Cited

U.S. PATENT DOCUMENTS

| | | | |
|---|---|---|---|
| 4,958,080 | A | 9/1990 | Melcher |
| 5,667,583 | A | 9/1997 | Kurata et al. |
| 7,264,750 | B2 | 9/2007 | Kurashige et al. |
| 2002/0144640 | A1* | 10/2002 | Andreaco ............... C30B 33/00 117/2 |
| 2006/0086311 | A1* | 4/2006 | Zagumennyi ........... C04B 35/16 117/13 |

(Continued)

OTHER PUBLICATIONS

F. Daghighian, P. Shenderov, KS Pentlow, MC Graham, B. Eshaghian, CL Melcher, and JS Schweitzer, "Evaluation of cerium doped lutetium oxyorthosilicate (LSO) scintillation crystals for PET", Nuclear Science, IEEE Transactions on, 40(4):1045-1047, 1993.

(Continued)

Primary Examiner — Robert M Kunemund

(57) ABSTRACT

The use of the effect of crystallographic axis orientation on the effectiveness in annealing in multiple atmospheres and chemical compositions of lutetium oxyorthosilicate crystals and other scintillator crystals is disclosed. By controlling axis orientation an favorable annealing condition can be selected to repair both internal interstitial and vacancy defects through the crystal lattice. Axis orientation can be further utilized to control the uniformity of surface finish of chemically etched crystal.

17 Claims, 9 Drawing Sheets

(56) References Cited

U.S. PATENT DOCUMENTS

2007/0188717 A1 8/2007 Melcher
2014/0061537 A1* 3/2014 Zagumennyi ........... C30B 29/34
252/301.6 F

OTHER PUBLICATIONS

BC Grabmaier, "Crystal scintillators", Nuclear Science, IEEE Transactions on, 31(1):372-376, 1984.

S. Mrowec and S. Marcinkiewicz, "Defects and diffusion in solids: Cn Introduction", Elsevier 1980, 466 pages (abstract attached).

VV Yanovsky, VA Chizhov, and VM Skorikov, "BGO crystals—radiation hard scintillators", Nuclear Instruments and Methods in Physics Research Section A: Accelerators, Spectrometers, Detectors and Associated Equipment, 309 (3):596-597, 1991.

MA Mariscotti, "A method for automatic identification of peaks in the presence of background and its application to spectrum analysis", Nuclear Instruments and Methods, 50(2):309-320, 1967.

* cited by examiner

RARE EARTH OXYORTHOSILICATE SCINTILLATION CRYSTALS

CROSS-REFERENCE TO RELATED APPLICATIONS

This application claims the benefit of U.S. Provisional Application Ser. No. 61/782,978, filed Mar. 14, 2013, which provisional application is incorporated herein by reference.

INTRODUCTION

Cerium doped lutetium oxyorthosilicate (LSO) (C. L. Melcher. Lutetium orthosilicate single crystal scintillator detector, Sep. 18, 1990. U.S. Pat. No. 4,958,080.) was a new scintillator developed in 1990 for the detection of gamma rays and other high energy particles. This material quickly became the preferred material for use in positron emission tomography (PET) (F. Daghighian, P. Shenderov, K S Pentlow, M C Graham, B. Eshaghian, C L Melcher, and J S Schweitzer. Evaluation of cerium doped lutetium oxyorthosilicate (LSO) scintillation crystals for PET. Nuclear Science, IEEE Transactions on, 40(4):1045-1047, 1993.). Since LSO began mass crystal growth production in 1997 many improvements have been made to improve cracking, boule size, light output, energy resolution, and decay time. Annealing of rare earth and other scintillator crystals such as LuAP, LGSO, LYSO, GSO, BGO, CsI, NaI, etc. is known in the crystal growth industry to improve or repair some crystal defects (B C Grabmaier. Crystal scintillators. Nuclear Science, IEEE Transactions on, 31(1):372-376, 1984; VV Yanovsky, V A Chizhov, and V M Skorikov. BGO crystals—radiation hard scintillators. Nuclear Instruments and Methods in Physics Research Section A: Accelerators, Spectrometers, Detectors and Associated Equipment, 309 (3):596-597, 1991) Annealing can provide both thermal and chemical changes in the crystal structure. This knowledge of annealing is applied to the manufacturing of lutetium based oxyorthosilicate crystals to decrease mechanical stress, increase crystal performance, and remove volatile surface contaminates. To improve the quality of LSO, methods have been developed to increase the performance of annealing.

SUMMARY OF THE DISCLOSURE

This disclosure discloses, among other things, selecting crystal orientations of scintillation crystals to achieve certain scintillation properties of the crystals and/or satisfy other requirements, such as cracking rates and uniformity in crystal surface smoothness, in annealing and/or chemical etching.

A method have been developed for making improved lutetium-based and other rare earth oxyorthosilicate crystal manufacturing by utilizing crystallographic axis to change the effects of annealing and provide a uniform surface finish of chemically etched pixels (i.e., scintillator cells, or elements, that are typically cut from as-grown crystals; pixels may be arranged to form component (detector) arrays or matrices). Pixels can be chemically etched in a variety of acids, such as all forms of phosphoric, pyrophosphoric, hydrochloric and hydrofluoric, nitric, sulfuric acid by liquid or gas phases, as well strong bases, especially potassium or sodium hydroxides.

DETAILED DESCRIPTION

Figure 1:
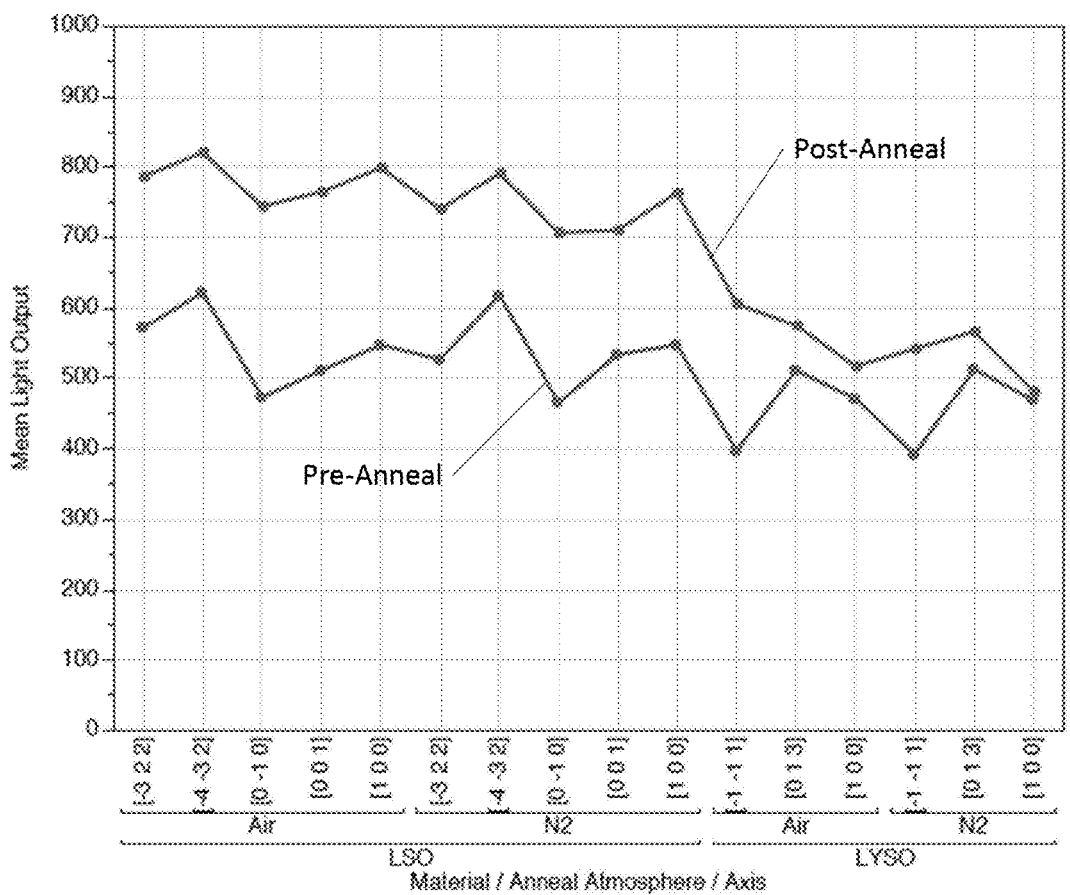
FIG. 1 shows the mean scintillation light output for each set of 10 pixels before and after annealing process in air and nitrogen, respectively.

Crystallographic structures are characterized by the orderly distribution of atoms or molecules in space creating a periodic structure of identical elements (unit cells) in all three dimensions. However, this perfect crystallographic structure exist only in the hypothetical 'ideal' crystals. Real crystals contain certain amount of imperfections, or structural defects. These defects can be in general divided in two distinct categories:

1. Thermodynamically irreversible defects occurring in the crystals in amounts independent of the temperature and pressure of the surroundings such as: line defects, screw and edge dislocations, shift atoms, and twinning Annealing and other heat treatment processes cannot correct for these defects.
2. Thermodynamically reversible defects that occur in concentrations depending on the temperature and pressure of the surrounding environment during the process of crystal growth and/or post growth heat treatment. These types of defects include point defects, i.e., a variety of irregularities of periodic structure caused by lack of atoms/ions in definitive sites of the lattice or presence of additional atoms in interstitial positions. Annealing or heat treatment can potentially reduce the concentrations of defects of this type.

Point defects in the lattice create certain equilibria that can be expressed in form of kinetic equations describing quasi-chemical reversible reactions. These equations are based on the fact that any changes in the lattice structure related to diffusion and/or reorientation of point defects must observe the law of mass conservation (number of atoms/ions participating in a defect reaction must be the same before and after reaction). Moreover, the reactions of formation and elimination of defects, should have no effect on total electrical charge of the crystal, which is always equal to zero to fulfill the requirements of electrical neutrality of the lattice. In contrast to thermodynamically irreversible defects, point defects have dimensions of the same order as those of elementary cells. Under certain conditions defects can move through the crystal as a result of jumps of atoms/ions into interstitial positions or as a result of migration of a vacant lattice. Thus, the phenomenon of transport of matter in crystals is closely related to existence of point defects. Since various kinds of point defects can occur in the crystal structure depending on type of crystal and external conditions there are many mechanism of lattice diffusion. Some of these mechanisms may involve atom/ion exchanges, ring, vacancy, relaxation mechanisms, interstitial, crowding, ascending diffusions, and many others (S. Mrowec and S. Marcinkiewicz, Defects and diffusion in solids: an introduction, Elsevier 1980). Diffusion of a solid can take two forms, interstitial in which atoms move internally though the crystalline structure and externally by introduction of an environment such as a gas whose atoms, to some extent, migrate through the structure. Both atomic processes assist in the correction of crystal defects.

Two fundamental laws, derived by Fick, govern the overall diffusion process. The first law gives relation between flux, i.e. the amount of substance flowing per unit time per unit of surface area perpendicular to the flux and concentration gradient of the diffusing substance:

$$J = -D\frac{\partial c}{\partial x},$$

where J is the flux of substance diffusing in direction x, c is concentration of defects perpendicular to flow, $\partial c/\partial x$ represents concentration gradient in direction of flow, and D is the diffusion coefficient. D determines the rate of diffusion at unit concentration gradient and hence it is a measure of the rate at which a system tends to eliminate concentration difference.

However, if the concentration gradient changes over time (t) then Fick's second law applies:

$$\frac{\partial c}{\partial t} = \frac{\partial}{\partial x}\left(D\frac{\partial c}{\partial x}\right).$$

Assuming that diffusion coefficient is independent of concentration, the equation becomes:

$$\frac{\partial c}{\partial t} = D\frac{\partial^2 c}{\partial^2 x}.$$

Specific mechanisms of diffusion are dependent on the type of crystal, nature of atomic/ionic bonds and type of dominant point defect structure and orientation in the crystal lattice. Diffusion rates in certain crystallographic directions will have different values. Therefore there are preferable directions in the crystallographic lattices that will allow more efficient diffusion and elimination of certain defects. This phenomenon was proved experimentally in this disclosure (for more details concerning diffusion of points defects authors refer to the book by S. Mrowec and S. Marcinkiewicz, Defects and diffusion in solids: an introduction, Elsevier 1980).

By controlling the crystal lattice orientation the diffusion rates for both internal interstitial and by external gas diffusion can be changed. Therefore, diffusion in certain crystallographic directions provides greater annealing efficiency. Thus, scintillation properties, such as light output performance, may be more greatly enhanced after annealing (such as in $N_2$ or air) for pixels oriented along certain crystallographic axes than for others. Furthermore, the crystallographic orientation of a pixel may also impact its response to chemical etching and other properties such as tendency to crack during heating and cooling due to anisotropy in thermal expansion coefficient.

Figure 3A:
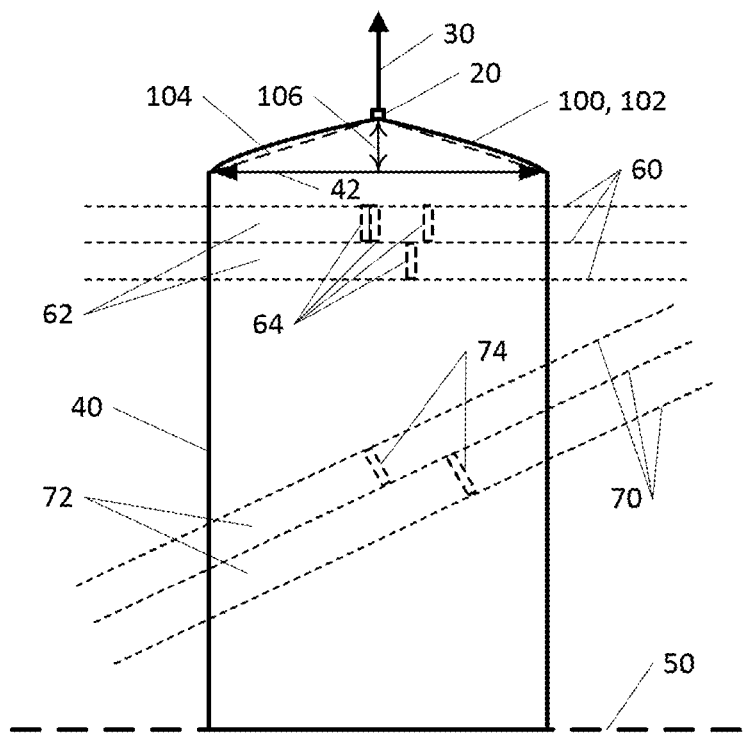
FIG. 3(a) schematically shows a single crystal boule of a rare-earth oxyorthosilicate, and its making from a melt, as well as slabs and pixels that can be cut from the boule, according to aspects of the disclosure.

Referring to FIG. 3(a), rare-earth oxyorthosilicate, such as LSO and LYSO (doped with an activator such as Ce, and optionally one or more codopants, such as Mg, Ca or Sr, or other elements of Group 1, 2, 3, 7 or 12 of periodic table of elements), single crystal boules can be made according to one aspect of the disclosure. In one example, a single crystal boule is formed from a melt 50 by, for example, the Czochralski technique. The boule is formed by contacting a seed 20 of a selected crystallographic orientation with the melt 50 and then gradually removed from the melt in a direction 30. A tapered portion 100 is initially formed, followed by a generally cylindrical portion 40 of diameter 42. The tapered portion 100 has a surface, which may be substantially conical (as indicated by the dashed straight line segments 104) or more rounded (as indicated by the curved segments 102). The crystal growth process may be controlled to result in either a more gradually or less gradually tapered potion 100. In examples where the tapered portion 100 is substantially conical, for example, the opening angle (spanned by the line segments 104) can be 60° to nearly 180°. For example, the opening angle can be 165° to 175°, or about 170°. Regardless of whether the tapered portion 100 is more conical or rounded, the degree of tapering can also be measured by the ratio between the height 106 of the tapered portion 100 and the diameter 42 of the base of the tapered portion 100 (also the cross-section of the cylindrical portion 40). For example, the ratio can be from nearly zero (corresponding to a 180° opening angle for a cone) to about 0.87 (corresponding to a 60° opening angle for a cone).

Once a single crystal boule is grown, slabs can be cut from the boule by slicing along typically parallel planes 60 or 70. The slabs are typically made by slicing along planes 60 that are perpendicular to the boule axis 30 (also the seed pulling direction) but need not be, as indicated by the oblique planes 70.

Figure 3B:
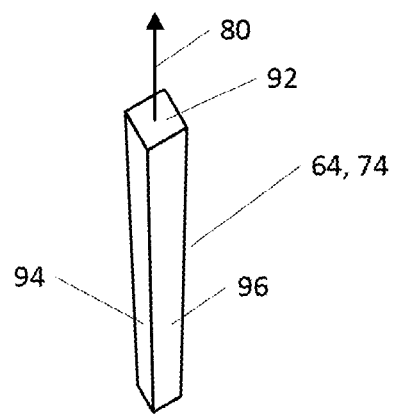
FIG. 3(b) schematically shows a pixel cut from the boule shown in FIG. 3(a) according to another aspect of the disclosure.

Pixels 64 or 74 can then be cut from the slabs. As shown in FIG. 3(b), each pixel 64 or 74 is typically elongated, with a longitudinal axis 80, a top surface 92 and side surfaces 94, 96. For example, pixels of dimensions of 4 mm×4 mm×20 mm can be cut from slabs of 20 mm thick. Depending on how the slab is cut from the boule, the longitudinal axis 80 can, but need not, have substantially the same crystallographic orientation as the boule axis 30.

The pixels can be subjected to annealing, or heat treatment, under a set of predetermined conditions, such as temperature, surrounding gas composition and duration. Similarly, slab can be annealed. Examples of suitable gas compositions for annealing include air, $N_2$, Ar, $N_2$ with 0-20% $O_2$, Ar with 0-20% $O_2$, mixtures of N2 and/or Ar with $CO_2$ and 0-20% $O_2$.

The pixels and/or slabs can further be subject to chemical etching and other treatments. Chemical etching, for example, can be used to produce smooth pixel surfaces.

According to one aspect of the present disclosure, the longitudinal axis 80 of the pixel 64, 74 or slabs can be chosen to be a predetermined crystallographic axis (or sufficiently close to the axis (such as within 20° or 10°)) to achieve one or more desired outcomes, including:

Scintillation properties, or improvement in scintillation properties, such as light yield, of the pixel as a result of the annealing;

Optical properties (e.g., uniformity in reflectivity) of the pixel surfaces;

Desired mechanical properties, such as a certain minimum level of mechanical stability, which may be measured, for example, in terms of cracking rates.

In selecting the crystallographic orientation of the longitudinal axis 80 of the pixels 64, 74, multiple criteria may be taken into consideration, and the result may not optimize a particular parameter, but meets the minimum requirements for a set of parameters. For example, it has been determined that with the longitudinal axis 80 oriented generally along the α-axis ("A orientation") or the [1 $\bar{1}$ $\bar{1}$] pole ("A/C orientation"), chemical etching produces optically smooth surfaces for both side surfaces 94, 96 for LSO crystals. However, a different orientation from those two may be chosen when other criteria, such as improvement of light yield by annealing, are taken into consideration.

EXAMPLES

Experimental Procedures

The Czochralski technique was used to grow cerium-doped LSO and LYSO single crystal boules. Boules were growth from inductively heated iridium crucibles. $Lu_2O_3$, $Y_2O_3$, $SiO_2$, and $CeO_2$ starting material were at least 99.99% pure, and the same concentration of Ce dopant (0.2% in the melt) was used for all growth runs. LSO was grown from seed material in 5 axis configurations, [1 0 0], [0 $\bar{1}$ 0], [0 0 1], [$\bar{3}$ 2 2], and [$\bar{4}$ $\bar{3}$ 2]. LYSO was growth from seed material in axis configurations, [1 0 0], [$\bar{1}$ $\bar{1}$ 1], [0 1 3]. Each seed was examined by the Laue back reflection method to guarantee the desired crystallographic orientation was within 5 degrees. Boules had a nominal diameter of 80 mm and length of 260 mm.

Each boule was cut into full diameter slabs of 20 mm thickness using an ID saw with a fixed diamond abrasive. From the slab 4×4×20 mm pixels were cut using a free abrasive wire saw. All pixels were cleaned but not processed further prior to the first measurement. A selection of 20 random pixels was made across slabs from each boule. Each 20 pixel sample was then divided into two groups of 10 pixels.

After the pre-anneal measurement of light output and energy resolution the pixels were loaded into a high temperature molybdenum disilicade element box furnace and brought to 1400° C. Half of the samples, 10 pixels from each boule, were annealed in $N_2$ and the other half in air. These environments were maintained by a 10 l/min flow rate of the respective gas. A second post-anneal measurement was performed after this annealing process.

Light output and energy resolution measurements were taken after storing the pixels in the dark for at least 20 hours. Measurements were performed on a Hamamatsu R877 photomultiplier tube. Each pixel was coupled to the PMT on its 4×4 mm cross section. A BGO reference crystal was used for calibration by setting the photo peak to channel 100. We excited the crystal with 662 keV gamma rays from a 10 µCi $^{137}$Cs source located ~20 mm from the crystal surface. Measurements were taken using Ortec's TRUMP PCI-8k multichannel analyzer and MAESTRO software. Peak detection was performed according to Mariscott's method (M A Mariscotti. A method for automatic identification of peaks in the presence of background and its application to spectrum analysis. Nuclear Instruments and Methods, 50(2): 309-320, 1967). Light output and energy resolution measurements were repeatable within ±2%.

A second selection of two random pixels were made from each boule. These pixels were then mechanically polished to remove any surface defects created in the cutting process and provide a uniform surface finish. After polishing the sample was chemically etched in heated (e.g., at about 190 to 200° C.) concentrated pyrophosphoric acid for 10 minutes. A surface measurement was made on each side of the pixels using a Keyence FS-V21RM fiber optic reflectance sensor.

Results

Each boule represents a different crystallographic axis and material. A sample of 20 pixels was taken from each boule at random to provide a good distribution of the characteristics of each crystallographic axis and material. The 20 pixel sample was split into two groups of 10, one group annealed in an air environment while the other in $N_2$. After annealing each group of 10 pixels was measured for scintillation light output under gamma-ray excitation. The mean light output was then calculated for subgroups before and after anneal, FIG. 1 shows a plot of the results. All measurements are relative to a value of channel 100 for a BGO reference crystal. It is evident from the figure that annealing improves light yield of Lutetium oxyorthosilicate crystals and a range of 9-60% improvement are demonstrated. For reference, actual mean light outputs for all subgroups are shown in Table I for LSO and Table II for LYSO.

TABLE I

LSO mean light output results for each 10 pixel sample of a specific crystallographic axis before and after annealing in air and $N_2$.

| | | Axis | | | | |
|---|---|---|---|---|---|---|
| | | [1 0 0] | [0 $\bar{1}$ 0] | [0 0 1] | [$\bar{3}$ 2 2] | [$\bar{4}$ $\bar{3}$ 2] |
| LO Pre-Anneal | Air | 547 | 474 | 512 | 573 | 622 |
| LO Post-Anneal | Air | 800 | 744 | 765 | 787 | 821 |
| LO Pre-Anneal | N2 | 548 | 466 | 534 | 527 | 618 |
| LO Post-Anneal | N2 | 763 | 707 | 711 | 740 | 792 |

TABLE II

LYSO mean light output results for each 10 pixel sample of a specific crystallographic axis before and after annealing in air and $N_2$.

| | | Axis | | |
|---|---|---|---|---|
| | | [$\bar{1}$$\bar{1}$1] | [100] | [013] |
| LO Pre-Anneal | Air | 397 | 471 | 512 |
| LO Post-Anneal | Air | 607 | 517 | 575 |
| LO Pre-Anneal | N2 | 392 | 470 | 513 |
| LO Post-Anneal | N2 | 542 | 482 | 566 |

Figure 2:
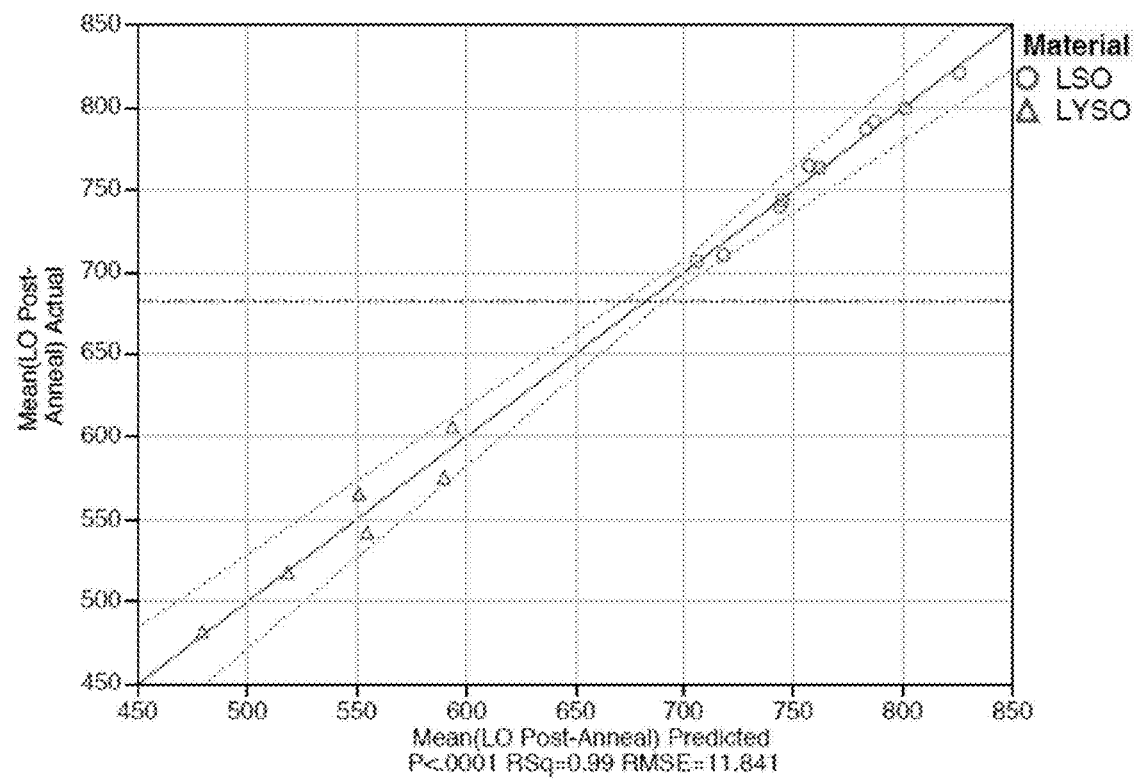
FIG. 2 shows Actual by predicted plot of fitted model of post-anneal light output. Circles indicate LSO and triangles LYSO.

To determine the significance of each experimental parameter a three factor factorial model was fit to the mean post-anneal light output data using material, atmosphere, and crystallographic axis. This produced a very strong model with an $R^2$ value of 0.99, an $R^2$ value of 1 indicates a model that fits the data perfectly. For each parameter effect a p-value was calculated and all were found to have a very low p-value of less than 0.001. This indicates a strong statistical significance of material, axis, and atmosphere effect on post-anneal light output of a crystal. Summary statistics of the fitted model and parameter estimates are found in Table III. To visualize the model a plot of actual by predicted values with a 95% confidence interval band is provided in FIG. 2. It is seen that the regression model closely fits the actual data. Upon further inspection of the parameter estimates indicate crystallographic axis plays a larger significance than atmosphere in all but two axis configurations, [1 0 0] and [$\bar{3}$ 2 2]. The results indicate that axes [$\bar{4}$ $\bar{3}$ 2] and [0 1 3] provide an annealing improvement of 40 and 20 light output channels above axis [1 0 0] respectively. While axes [0 $\bar{1}$ 0] and [0 0 1] lowered annealing effectiveness 46 and 29 light output channels below axis [1 0 0] respectively.

TABLE III

Fitted model results of mean post-anneal light output.

Summary of Fit

| | |
|---|---|
| RSquare | 0.99498 |
| RSquare Adj | 0.989242 |
| Root Mean Square Error | 11.84118 |
| Mean of Response | 682.3836 |
| Observations (or Sum Wgts) | 16 |

Analysis of variance

| Source | DF | Sum of Squares | Mean Square | F Ratio |
|---|---|---|---|---|
| Model | 8 | 194528.80 | 24316.1 | 173.4219 |
| Error | 7 | 981.49 | 140.2 | Prob > F |
| C. Total | 15 | 195510.29 | | <.0001* |

Effect Tests

| Source | Nparm | DF | Sum of Squares | F Ratio | Prob > F |
|---|---|---|---|---|---|
| Material | 1 | 1 | 79485.653 | 566.8901 | <.0001* |
| Axis | 6 | 6 | 15688.259 | 18.6481 | 0.0006* |
| Anneal Atmosphere | 1 | 1 | 6128.150 | 43.7058 | 0.0003* |

Parameter Estimates

| Term | Estimate | Std Error | t Ratio | Prob > \|t\| |
|---|---|---|---|---|
| Intercept | 648.09271 | 3.487317 | 185.84 | <.0001* |
| Material[LSO] | 140.966 | 5.92059 | 23.81 | <.0001* |
| Axis[[−1 −1 1]] | 67.356286 | 10.83151 | 6.22 | 0.0004* |
| Axis[[−3 2 2]] | −25.47971 | 8.789796 | −2.90 | 0.0230* |
| Axis[[−4 −3 2]] | 17.231786 | 8.789796 | 1.96 | 0.0908 |
| Axis[[0 −1 0]] | −63.67721 | 8.789796 | −7.24 | 0.0002* |
| Axis[[0 0 1]] | −51.45521 | 8.789796 | −5.85 | 0.0006* |
| Axis[[0 1 3]] | 63.629286 | 10.83151 | 5.87 | 0.0006* |
| Anneal Atmosphere[Air] | 19.570625 | 2.960295 | 6.61 | 0.0003* |

Figure 4:
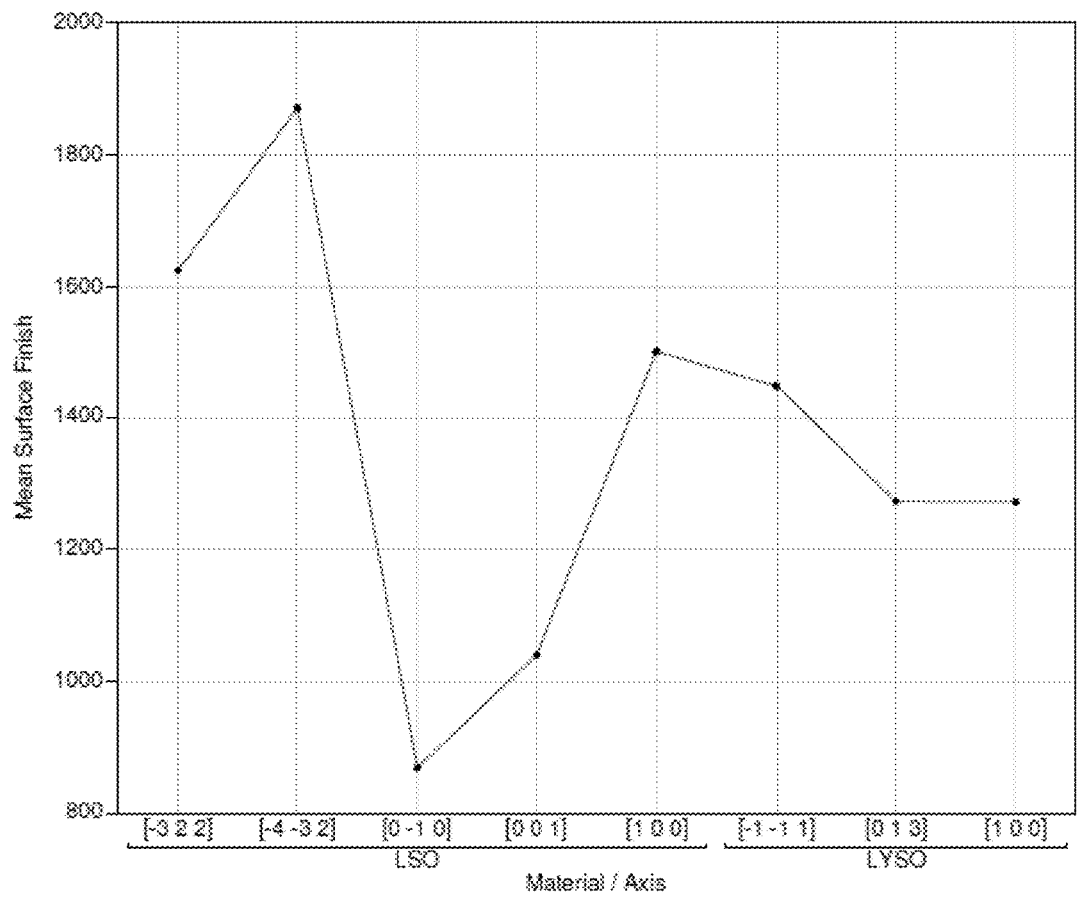
FIG. 4 shows the mean surface finish measurement for each boule after chemical etch in one example.
Figure 5:
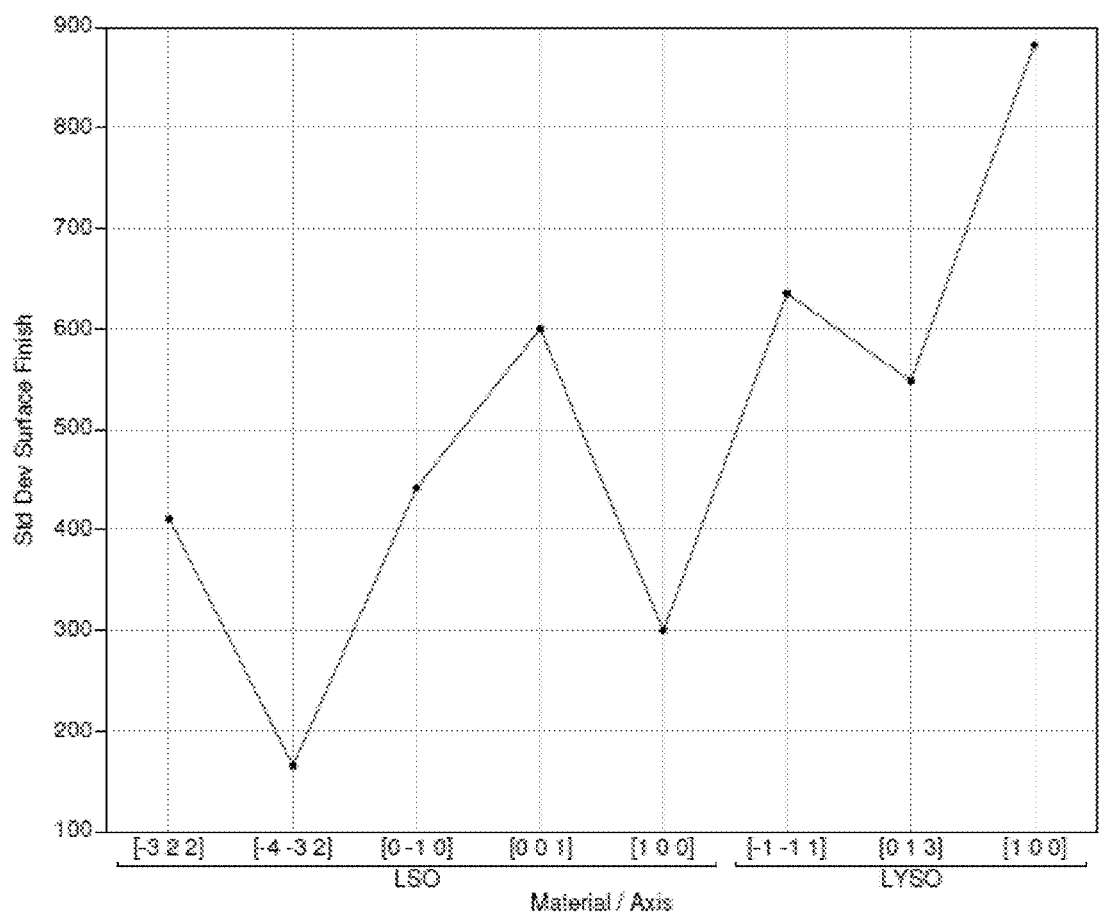
FIG. 5 shows standard deviation of finish measurement for each boule after chemical etch in one example.
Figure 6:
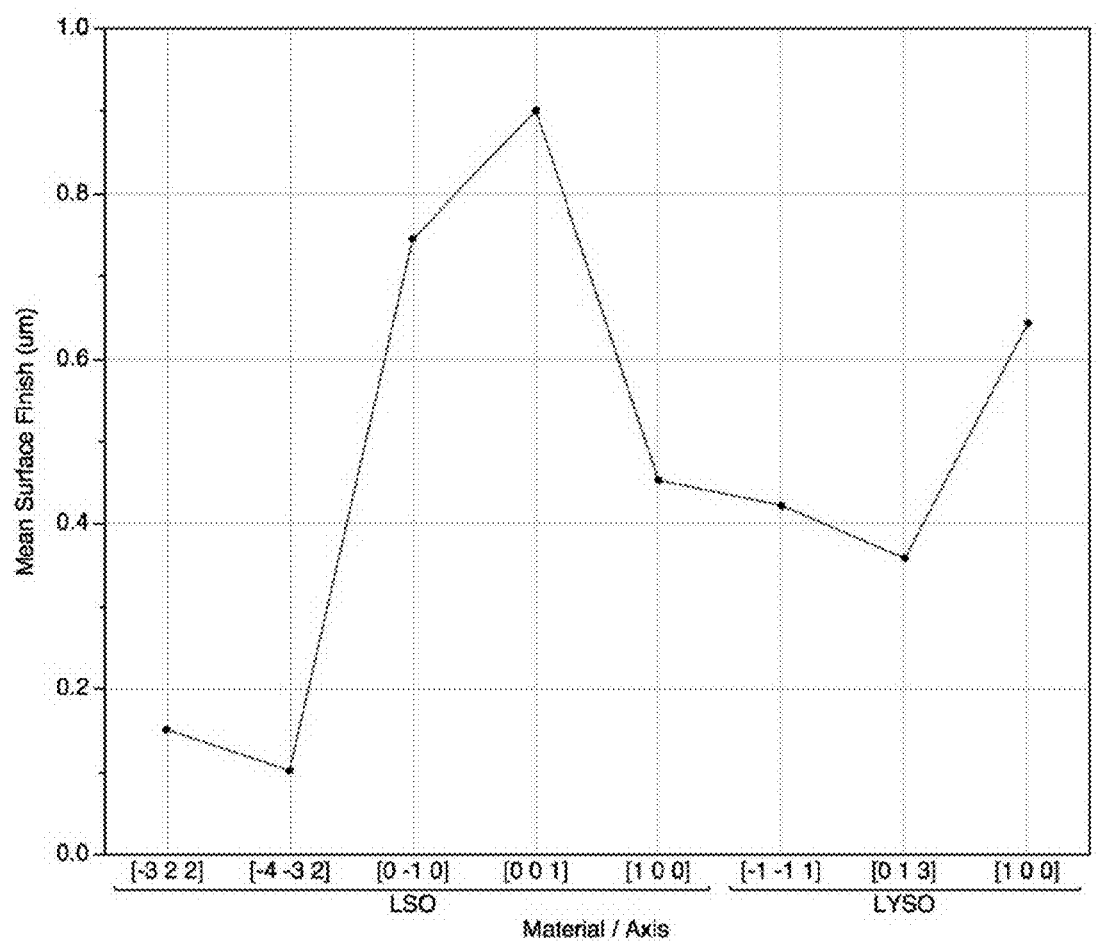
FIG. 6 shows the surface finish of LSO [$\bar{4}\,\bar{3}\,2$] 90 degrees apart in one example.
Figure 7:
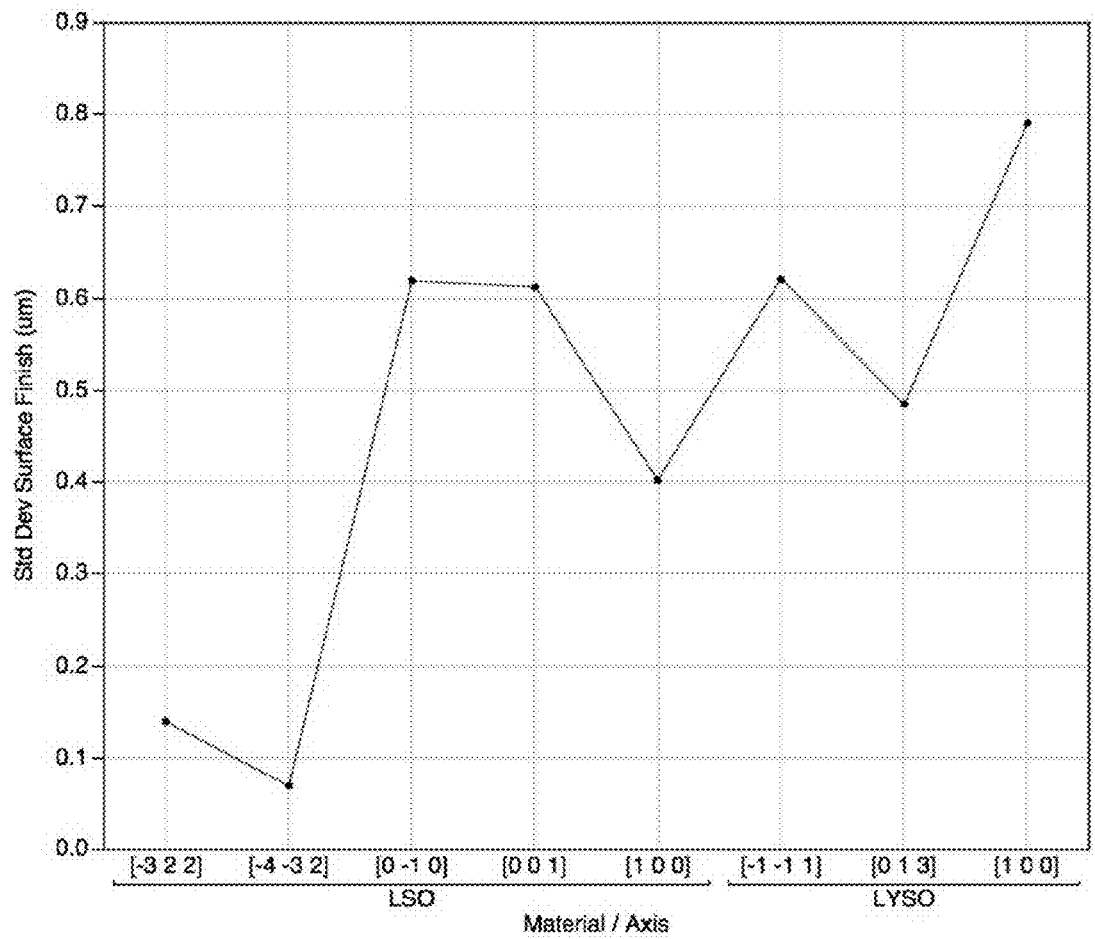
FIG. 7 shows the surface finish of LYSO [1 0 0] 90 degrees apart in one example.
Figure 8:
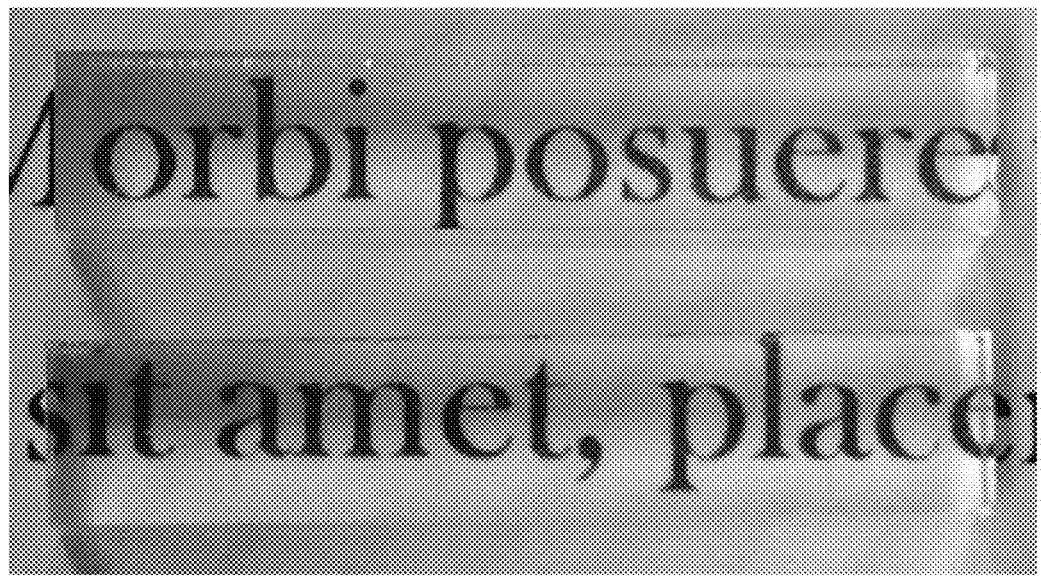
FIG. 8 shows standard deviation of finish measurement for each boule after chemical etch in one example.
Figure 9:
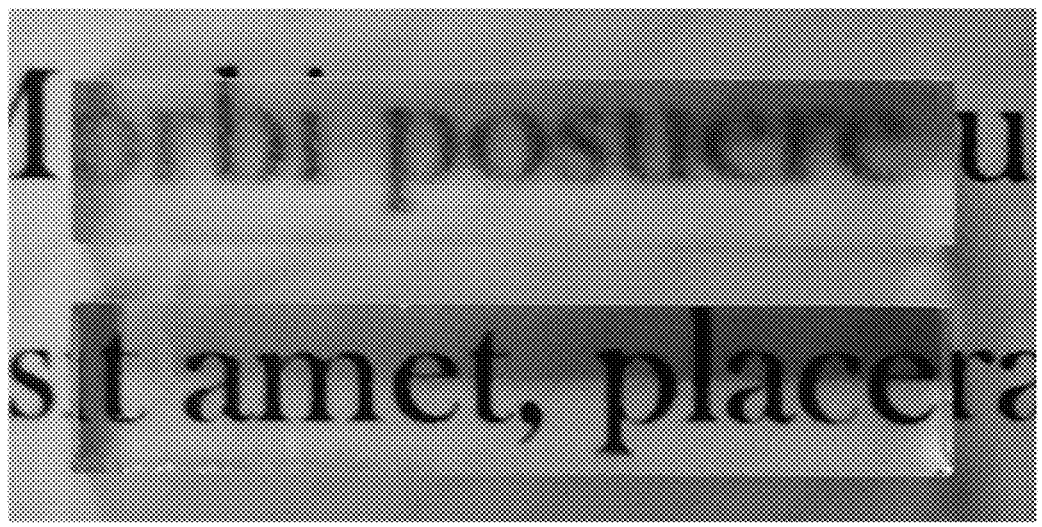
FIG. 9 shows the 3D surface roughness, $S_a$, for each boule after chemical etch in one example.

The second two pixel sample from each boule was measured for surface finish on all sides and a mean and standard deviation of surface measurement was calculated for each boule. FIGS. 4 and 5 show plots of the results, respectively. Another set of results are shown in FIGS. 6 and 7, respectively. Smaller values of surface texture indicate more optically clear surfaces. Each axis of orientation caused differences in the uniformity of the surface after chemical etching, as seen from the standard deviation of the surface measurements. Larger values of the standard deviation indicate pixels with distinguishable differences. This is best demonstrated in FIGS. 8 and 9, each showing two etched elements viewed from the 4 mm×20 mm sides that are 90 degrees from each other. The clarity, or smoothness, of the surfaces is indicated by the visual clarity of the printed letters over which the elements are placed. FIG. 8 shows a uniform surface finish on all sides with very high clarity, whereas FIG. 9 shows poor uniformity but high clarity on two long sides. A desired combination of surface finishes can be controlled though axis selection.

CONCLUSION

The results presented above demonstrate the effect of crystallographic axis orientation on the effectiveness in annealing in multiple atmospheres and chemical compositions of lutetium oxyorthosilicate crystals. By controlling axis orientation an optimal annealing condition can be selected to repair both internal interstitial and vacancy defects through the crystal lattice. Axis orientation can be further utilized to control the uniformity of surface finish of chemically etched crystal.

Because many embodiments of the invention can be made without departing from the spirit and scope of the invention, the invention resides in the claims hereinafter appended.

We claim:

1. A method of making a scintillator component, comprising:
    cutting an elongated monocrystalline scintillator element from a volume of the monocrystalline scintillator material, the elongated scintillator element having a longitudinal axis at least generally aligned with a first selected crystallographic axis; and
    subjecting the elongated scintillator element to annealing under one or more conditions,
    the first crystallographic axis being selected at least partially to achieve a minimum value of, or amount of improvement in, a scintillation property of the elongated scintillator element by the annealing under the one or more conditions.

2. The method of claim 1, the monocrystalline scintillator material comprising a rare-earth oxyorthosilicate scintillator material.

3. The method of claim 2, wherein the rare-earth oxyorthosilicate scintillator material comprises a lutetium oxyorthosilicate.

4. The method of claim 2, wherein subjecting the elongated scintillator element to annealing under the one or more conditions comprises annealing the elongated scintillator element in an atmosphere of air, $N_2$, Ar, $N_2$ with 0-20% $O_2$, Ar with 0-20% $O_2$, mixtures of $N_2$, or Ar with $CO_2$ and 0-20% $O_2$.

5. The method of claim 2, wherein the rare-earth oxyorthosilicate scintillator material includes with an activator and a codopant of Group 1, 2, 3, 7 or 12 of periodic table of elements, or any combination of the codopants.

6. The method of claim 2, further comprising growing the volume of the monocrystalline scintillator material from a melt by forming a substantially cylindrical boule from the melt, the substantially cylindrical boule having a longitudinal axis generally aligned with the first crystallographic axis.

7. The method of claim 6, wherein the growing the volume of the monocrystalline scintillator material from a melt comprises growing the volume of the monocrystalline scintillator material from a seed crystal by increasing a distance between the seed crystal from a surface of the melt and forming a tapered portion of the monocrystalline scintillator material having an apex substantially at the seed crystal and base portion, the tapered portion defining a height from the base portion to the apex and a width of the base portion, the height being from about 0 to about 0.8 of the width of the base portion.

8. The method of claim 2, wherein the longitudinal axis of the elongated scintillator element is within about 20° from first crystallographic axis.

9. The method of claim 8, wherein the longitudinal axis of the elongated scintillator element is within about 10° from first crystallographic axis.

10. The method of claim 2, the elongated scintillator element defining a first side surface generally parallel to the longitudinal axis, the first side surface defining a second crystallographic orientation, the method further comprising subjecting the elongated scintillator to chemical etching, the second crystallographic orientation being selected to achieve a surface quality of the first side surface by the chemical etching.

11. The method of claim 10, the elongated scintillator element further defining a second side surface generally parallel to the longitudinal axis, the second side surface defining a third crystallographic orientation generally transverse to the second crystallographic orientation, the third crystallographic orientation being selected achieve a substantially same optical surface quality as the first side surface.

12. The method of claim 10, wherein the first crystallographic axis is [1 0 0], [1 $\bar{1}$ $\bar{1}$], [$\bar{4}$ $\bar{3}$ 2] or [0 13].

13. The method of claim 12, wherein the rare-earth oxyorthosilicate scintillator material comprises a lutetium oxyorthosilicate.

14. The method of claim 7, wherein the opening angle is between about 165° and about 175°.

15. A method of making a scintillator component, comprising:
   growing a volume of the monocrystalline scintillator material from a melt by forming a substantially cylindrical boule from the melt, the substantially cylindrical boule having a longitudinal axis generally aligned with a first crystallographic axis;
   cutting a slab from the boule, the slab having a top and bottom surfaces defining a longitudinal axis generally aligned with a first crystallographic axis;
   cutting an elongated monocrystalline scintillator element from the slab, the elongated scintillator element having a longitudinal axis at least generally aligned with the first crystallographic axis; and
   subjecting the slab to annealing under one or more conditions,
   the crystallographic axis being selected at least partially to achieve a minimum value of, or amount of improvement in, a scintillation property of the elongated scintillator element by the annealing under the one or more conditions.

16. The method of claim 15, wherein the monocrystalline scintillator material comprises an LSO crystal, and the first crystallographic axis is generally aligned with the [1 0 0] or [1 $\bar{1}$ $\bar{1}$] pole of the LSO crystal.

17. The method of claim 15, the crystallographic axis being selected at least to further achieve a minimum level of mechanical stability.

* * * * *